United States Patent [19]
Weaver

[11] Patent Number: 5,935,268
[45] Date of Patent: Aug. 10, 1999

[54] METHOD AND APPARATUS FOR GENERATING AN ERROR DETECTION CODE FOR A MODIFIED DATA PACKET DERIVED FROM AN ORIGINAL DATA PACKET

[75] Inventor: Jeffrey C. Weaver, Redwood City, Calif.

[73] Assignee: Bay Networks, Inc., Santa Clara, Calif.

[21] Appl. No.: 08/868,784

[22] Filed: Jun. 3, 1997

[51] Int. Cl.⁶ ........................... H03M 13/00; G06F 11/10
[52] U.S. Cl. ............................................ 714/758; 714/807
[58] Field of Search ............................... 371/37.11, 37.6, 371/37.8, 37.9, 38.1, 39.1, 48, 49.2, 53, 54, 37.7

[56] References Cited

U.S. PATENT DOCUMENTS

| | | | |
|---|---|---|---|
| 5,062,111 | 10/1991 | Gotou et al. ............................ | 371/37.1 |
| 5,694,407 | 12/1997 | Glaise ...................................... | 371/53 |
| 5,742,604 | 4/1998 | Edsall et al. ............................ | 370/401 |
| 5,859,837 | 1/1999 | Crayford ................................ | 370/230 |

*Primary Examiner*—Emmanuel L. Moise
*Attorney, Agent, or Firm*—Blakely, Sokoloff, Taylor & Zafman LLP

[57] ABSTRACT

A method and apparatus for generating an error detection code, such as a Cyclic Redundancy Checksum (CRC), for a modified binary data block. The modified data block, such as a VLAN frame, is derived from an original binary data block, such as an ethernet frame, having a first error detection code associated therewith. In one embodiment, the method requires modifying the original data block utilizing first data, in the form of VLAN header information, to generate the VLAN frame, whereafter a second error detection code is calculated exclusively for the VLAN header information. More specifically, where the original data block is modified by the insertion of the VLAN header information into the original data block, a CRC is calculated using the VLAN header information shifted to a position corresponding to its position within the modified data block. Having calculated the second error detection code, the first and second error detection codes are added so as to generate a third error detection code, which is associated with the VLAN frame. The first and second error detection codes are binary values, and the step of adding comprises XORing the first and second error detection codes. The third error detection code is also a binary value and has a bit-length equal to that of the first error detection code.

50 Claims, 14 Drawing Sheets

METHOD AND APPARATUS FOR GENERATING AN ERROR DETECTION CODE FOR A MODIFIED DATA PACKET DERIVED FROM AN ORIGINAL DATA PACKET

FIELD OF THE INVENTION

The present invention pertains to the field of data transmission and communication, and to the detection of errors in the transmission of data. More particularly, the present invention relates to the generation of a modified error detection code, such as a Cyclic Redundancy Checksum (CRC), for a modified data packet generated from an original data packet having an error detection code associated therewith.

BACKGROUND OF THE INVENTION

The detection and correction of errors that occur during the transmission of data is crucial to ensuring the reliability and integrity of data. A number of techniques of detecting the corruption of data during transmission are widely employed. At one end of the scale, a simple parity-checking method may be employed. Where more sophisticated detection and correction capabilities are required, checksum or Cyclic Redundancy Check methods are used.

Merely for example, a Cyclic Redundancy Check is a technique for preserving the integrity of a frame (or packet) that is being propagated from a data source to a data destination. Broadly, the Cyclic Redundancy Check (CRC) methodology requires that an n-bit sequence CRC, which may be a Frame Check Sequence (FCS), be generated for a frame, and appended to the frame prior to propagation from the data source. The CRC is propagated, together with the associated frame, from the data source to the data destination, and the CRC can then be utilized at the data destination to detect any corruption of the frame that may have occurred during transmission thereof.

An understanding of the generation of a CRC requires the definition of a number of structures, namely:

1. an "original frame", this being the frame to be transmitted, and being k. bits in length. The original frame may include data and header portions;
2. the CRC which is n-bits in length;
3. a "resulting frame", this frame being the combination of the original frame and the CRC, and having a total length of k+n bits; and
4. a predetermined CRC polynomial having a length of n+1 bits.

The CRC is generated so that the resulting frame is exactly divisible by the predetermined CRC polynomial. Accordingly, the CRC creation process at the data source involves receiving the original frame and shifting it n bits to the left. The shifted original frame is then divided by the predetermined CRC polynomial, the remainder of this division process then being the CRC. The CRC is then appended to the original frame to generate the resulting frame. The CRC check process at the data destination involves receiving the resulting frame, and dividing the resulting frame by the predetermined CRC polynomial. The remainder of this division process is then examined and, if it is not zero, the resulting frame has probably experience corruption during transmission. The Cyclic Redundancy Check (CRC) technique is advantageous in that it provides good error detection capabilities, requires little overhead and is relatively easy to implement.

When propagating data over a network, such as a Local Area Network (LAN), Wide Area Network (WAN), intranet or the Internet, the data is encapsulated with header information according to the network protocols employed by the relevant network. For example, a packet or frame, comprising a data portion and appropriate headers, may include a header from a physical layer, a header from a network layer and a header from a transport layer. FIG. 1 shows an example of a frame 10, or packet, conforming to the ethernet specification. The frame 10 includes a preamble 12, a destination address 14, a source address 16, a length or EtherType value 18, a data portion 20 and a CRC 22. The destination address 14 occupies 6 bytes of the frame 10, and identifies a data destination at which the frame 10 is to be received. A destination address of all one's (111's) may be used to indicate a broadcast message to be received at all data destinations of the network. The source address 16 also occupies 6 bytes of the frame 10, and specifies the data source from which the frame 10 originated. The length or EtherType value 18 occupies 2 bytes, and may indicate the length of the frame 10, excluding the preamble 12, the CRC 22 and the length value 18 itself. A "raw" ethernet frame may not have a length shorter that 64 bytes or longer the 1518 bytes.

The value 18 may also indicate an Ethernet type to which the frame 10 belongs, in which case the frame 10 may include further header information not shown in FIG. 1. For example, an EtherType value 18 could identify the frame 10 as being an Ethernet II, Ethernet SNAP (SubNetwork Access Protocol) or Ethernet IEEE 802.2 frame. The destination address 14, source address 16 and the length or EtherType value 18 together comprise a data link header 24. The frame 10 may include further headers, such as a Logical Link Control (LLC) header (not shown) or a SNAP header (not shown) to conform the frame 10 to the IEEE 802.2 and SNAP formats respectively. The data portion 20 follows the header 24, and may occupy between 38 and 1492 bytes, and may comprise upper layer headers and user data.

The CRC 22 is 4 bytes in length. The CRC 22 is generated utilizing all preceding bytes within the frame 10. As such, it will be appreciated that should any modification be made to the frame 10, the CRC 22 generated using the unmodified frame will be invalid. Such modifications may comprise encapsulating the frame 10 by inserting further header information into the frame 10, or modifying data within the data portion 20. For example, referring to FIG. 2, the ethernet frame 10 of FIG. 1 may be encapsulated as a Virtual Local Area Network (VLAN) frame 30 by the insertion of a VLAN type code 32 and a VLAN number (or identifier) 34 into the ethernet frame 10 to generate the VLAN frame 30. Similarly, the VLAN frame 30 may be unencapsulated by the removal of the fields 32 and 34 to reveal the ethernet frame 10. Such modifications to the contents of a frame require that the CRC 22 must either be modified or recalculated to be applicable to the contents of the modified frame.

One way in which the CRC 22 could be modified when header information is added to the frame 10 (or removed from the frame 30) is by the addition of supplementary bytes to the CRC 22, which would then allow the CRC 22 to be validated for the modified frame. However, this has the disadvantage that the length of the modified frame is then increased. This increase in frame length is undesirable from both transmission and hardware viewpoints. Specifically, an increased frame length could impact negatively on buffer design within data source and destination devices.

A second option is to calculate a fresh CRC utilizing the all preceding bytes of a modified frame, and to then discard the original CRC generated using the unmodified frame. This option has the disadvantage that the original CRC for the unmodified frame is discarded upon modification of the original frame, and that any data corruption which may have occurred after the generation of the original CRC and prior to the modification of the frame (and the accompanying recalculation of the CRC) will become undetectable The possibility of data corruption, which occurred after the generation of the original CRC, going undetected is highly undesirable.

SUMMARY OF THE INVENTION

According to a first aspect of the invention there is provided a computer-implemented method of generating an error detection code, such as a CRC, for a modified binary data block. The modified data block is derived from an original binary data block having a first error detection code associated therewith. The method requires modifying the original data block utilizing first data to generate the modified data block. A second error detection code is calculated for the first data. For example, where the original data block is modified by the insertion of the first data into the original data block to generate the modified data block, the step of calculating requires calculating the second error detection code for the first data shifted to a position corresponding to its position within the modified data block. Alternatively, where the modification comprises removing the first data from the original data block to generate the modified data block, the step of calculating requires calculating the second error detection code for the first data shifted to a position corresponding to its position within the original data block. Having calculated the second error detection code, the first and second error detection codes are added so as to generate a third error detection code for the modified data block.

The first and second error detection codes are binary values, and the step of adding may comprise XORing the first and second error detection codes. The third error detection code is also a binary value and has a bit-length equal to that of the first error detection code.

According to a second aspect of the invention there is provided an apparatus for generating an error detection code for a modified data block, the modified data block being derived from an original data block having a first error detection code associated therewith. The apparatus includes a first circuit configured to calculate a second error detection code for first data utilized to generate the modified data block from the original data block. A second circuit XORs the first and second error detection coded to generate a third error detection code for the modified data block. A third circuit may be provided to modify the original data block by shifting second data from an original position within the original data block to a modified position within the modified data block. In this case, the first circuit is configured to calculate a fourth error detection code for the second data shifted to a position corresponding to the original position within the original data block, and to calculate a fifth error detection code for the second data shifted to a position corresponding to the modified position within the modified data block. The second circuit then XORs the first, second, fourth and fifth error detection codes to generate the third error detection code for the modified data block.

According to a third aspect of the invention, there is provided a computer-readable medium having stored thereon a sequence of instructions which, when executed by a processor, cause the processor to perform the steps of the methodology as detailed above.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for generating an error detection code for a modified data packet, derived from an original data packet having an original error detection code associated therewith, are described. In the following description, for purposes of explanation, numerous specific details are set forth in order to provide a thorough understanding of the present invention. It will be evident, however, to one skilled in the art that the present invention may be practiced without these specific details.

Figure 3:
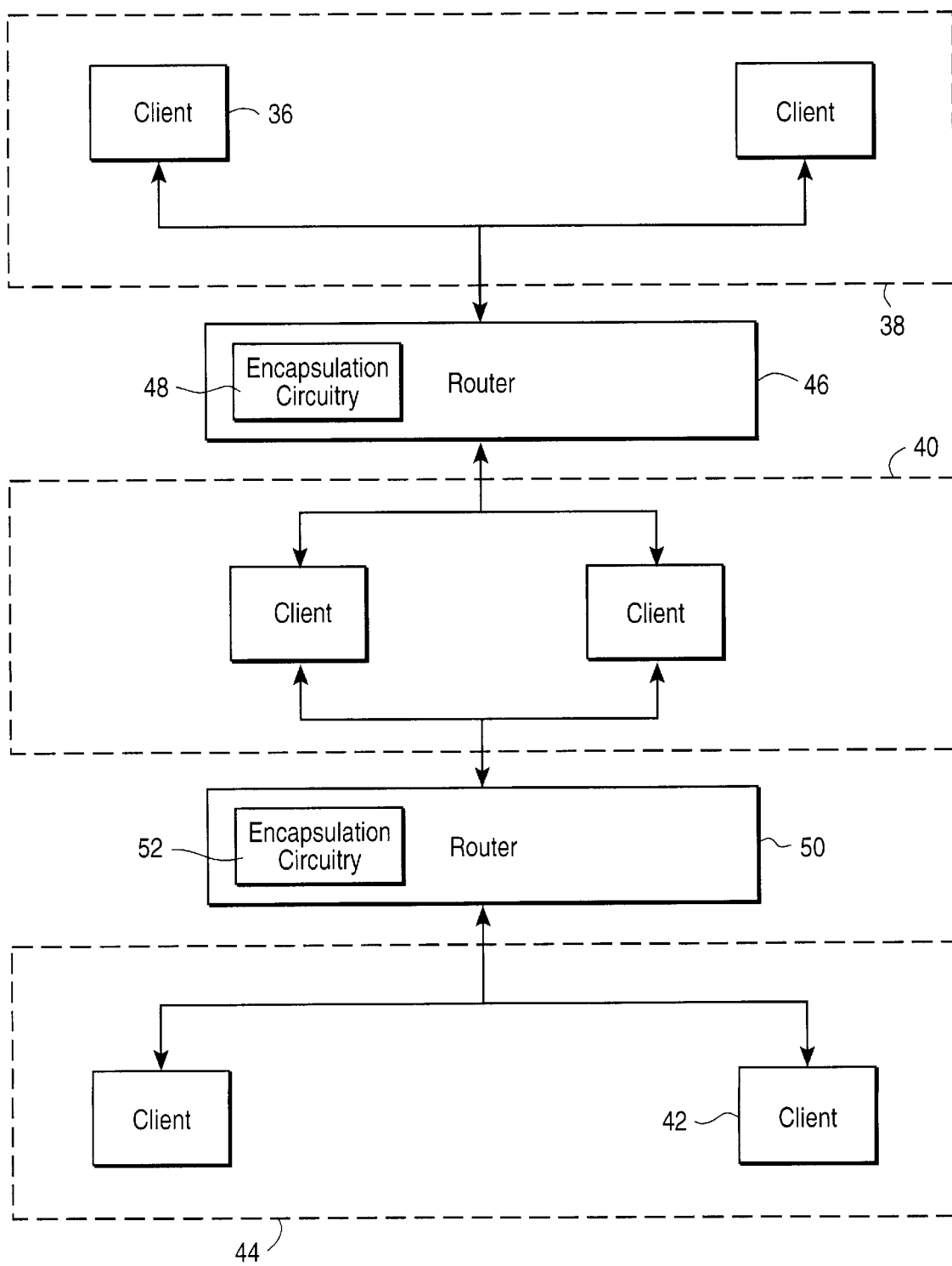
FIG. 3 is a diagrammatic representation of a network arrangement, comprising three Local Area Network (LANs), in which the present invention may be implemented.

In the field of computer networking, the term "encapsulation" (also referred to in the art as "tunneling"), refers to the process of inserting information, such as header information into a data packet, which conforms to a first protocol, to thereby conform the packet to a second protocol. The encapsulated data packet can then be transmitted over a network employing the second protocol and, if necessary, thereafter unencapsulated to again expose the original data packet conforming to the first protocol. The process of unencapsulating a data packet typically involves the removal of header information from the encapsulated data packet. While the process of encapsulation adds overhead, it provides a way to send packets from one network to another over an intermediate network which uses a different protocol. Merely for example, referring to FIG. 3, encapsulation may be utilized to transmit a message from a client 36, comprising part of a first network 38 employing a NetWare Internetworking Packet Exchange (IPX) protocol over a second network 40 employing the Transmission Control Protocol/Internet Protocol (TCP/IP) to a client 42 of a third network 44, which again employs the IPX protocol. To achieve the transmission of a data packet from the client 36 to the client 42, a IPX data packet is transmitted from the client 36 to a first router 46, which includes encapsulation circuitry 48. By inserting the appropriate header information into the IPX packet, the encapsulating circuitry 48 "disguises" the data packet as a TCP/IP packet which is then transmitted over the TCP/IP network 40 to a router 50, which includes unencapsulation circuitry 52. The circuitry 52 then removes the TCP/IP header information from the data packet, thereby revealing the original IPX data packet, which is then propagated within the IPX network 44 to the client 42.

Encapsulation may also be utilized within a computer network in the implementation of VLANs. VLANs may be viewed as a logical grouping of clients or end stations, which may or may not comprise part of a common physical Local Area Network (LAN). Accordingly, VLANs enable network managers, utilizing software, to create and specify logical groupings of users and network resources, regardless of where the relevant users and network resources actually reside within a network fabric. A VLAN may also be viewed as a mechanism which determines which end stations receive each others broadcast traffic. For example, all users in an organization performing a management function could be allocated to a "management VLAN", regardless of the users' actual physical location, and would thus only receive broadcast messages transmitted from other users belonging to the "management VLAN".

Figure 4:
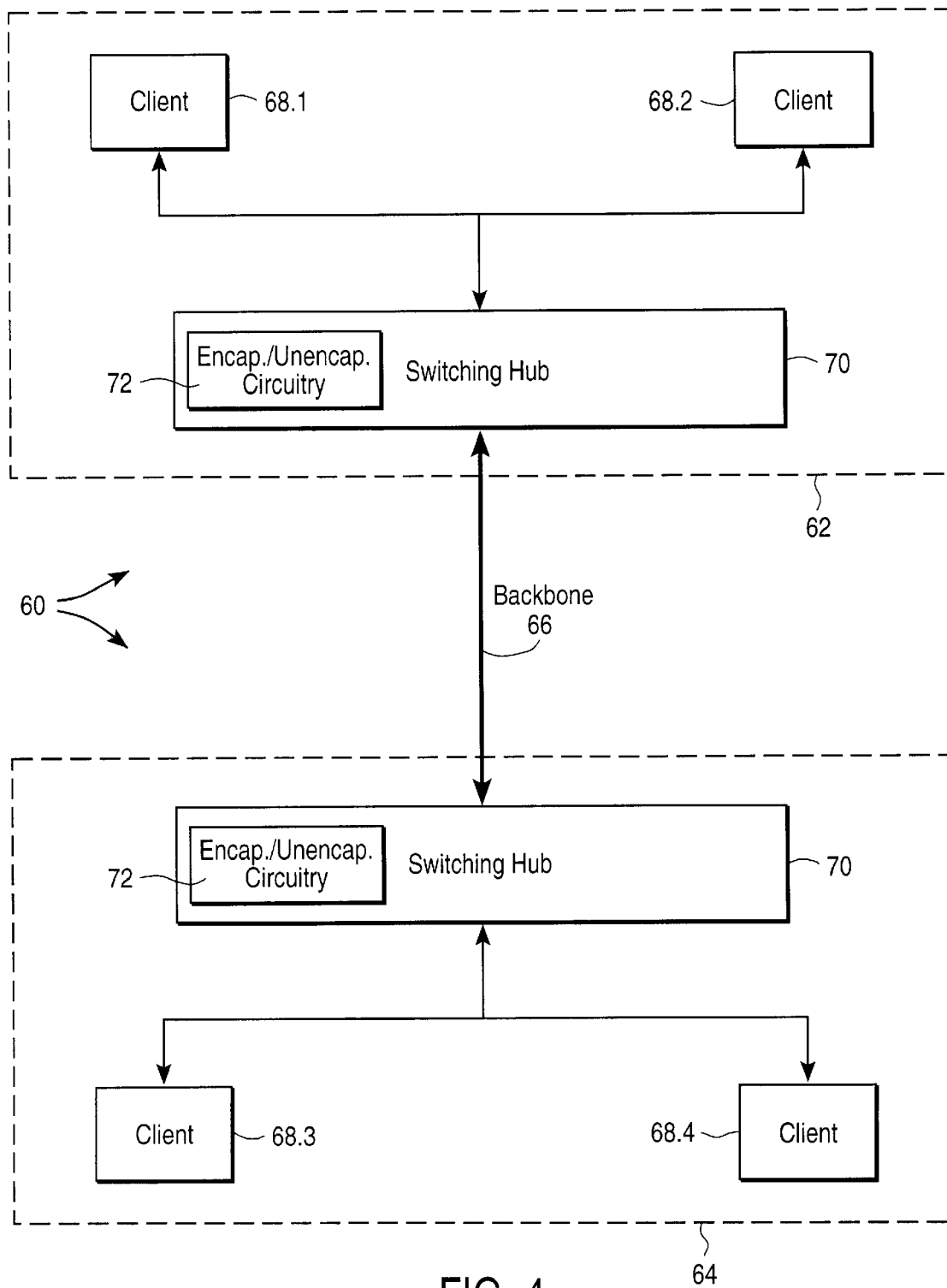
FIG. 4 is a diagrammatic representation of a network arrangement, comprising two LAN segments coupled by a backbone, in which the present invention may be implemented.

FIG. 4 shows an exemplary network arrangement 60 in which a VLAN is implemented. The network arrangement 60 comprises a first physical LAN segment 62, a second physical LAN segment 64, and a backbone 66 interconnecting the LAN segments 62 and 64. Each LAN segment 62 and 64 includes a number of clients 68, and a switching hub 70 for handling intersegment network traffic between the LAN segments 62 and 64. In the present example, assuming merely for example that an addresser client 68.1 of the LAN segment 62 and an addressee client 68.4 of the LAN segment 64 have been logically allocated to a common VLAN, a message broadcast from the client 68.1 and received, inter alia, at the switching hub 70, will be recognized by the switching hub 70 as a broadcast message. The switching hub 70 includes encapsulation/unencapsulation circuitry 72 which then encapsulates the broadcast message, which may conform to the ethernet protocol, as a VLAN message by inserting the appropriate header information into the message. In a further embodiment, encapsulation may also be performed utilizing encapsulation/unencapsulation software installed on the switching hub 70, as opposed to the encapsulation circuitry 72. The broadcast message, which now comprises a VLAN frame, is then transmitted over the backbone 66 for receipt by the switching hub 70 of the LAN segment 64. On receipt within the LAN segment 64, the switching hub 70 unencapsulates the VLAN frame, by removing the VLAN header information therefrom. Again the step of unencapsulating the VLAN frame may be performed by dedicated encapsulation/unencapsulation circuitry 72, or by appropriate software installed on the hub 70. The unencapsulation process reveals the original message conforming to, for example, the ethernet protocol which is then transmitted to the intended recipient, namely the addressee client 68.4.

Prior to the broadcast of the message, the addresser client 68.1 generates an error detection code for transmission with the message, so as to allow the validity of the message to be confirmed by the addressee client 68.4. The addresser client 68.1 calculates the error detection code utilizing a specific message content with the propose of facilitating the detection, and possible correction, of any changes in that message content which may occur during transmission. For the purposes of the specification, the term "error detection code" shall be taken to refer to any code or value generated for the purposes of detecting the modification of message content during transmission thereof. Examples of such error detection codes include checksums, Cyclic Redundancy Checksums (CRC) and Frame Check Sequences (FCS).

Figure 1:
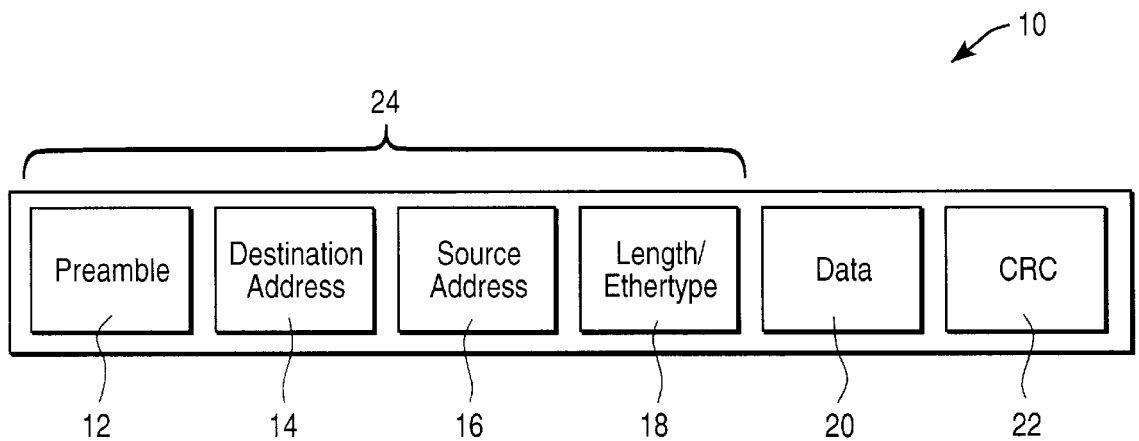
FIG. 1 is a diagrammatic representation of an ethernet frame.
Figure 2:
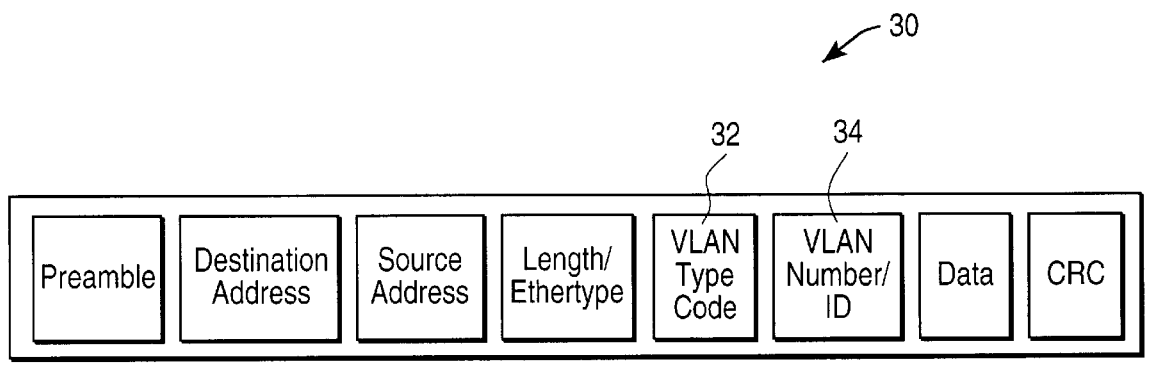
FIG. 2 is a diagrammatic representation of the ethernet frame of FIG. 1 encapsulated to constitute a Virtual Local Area Network (VLAN) frame.
Figure 5:
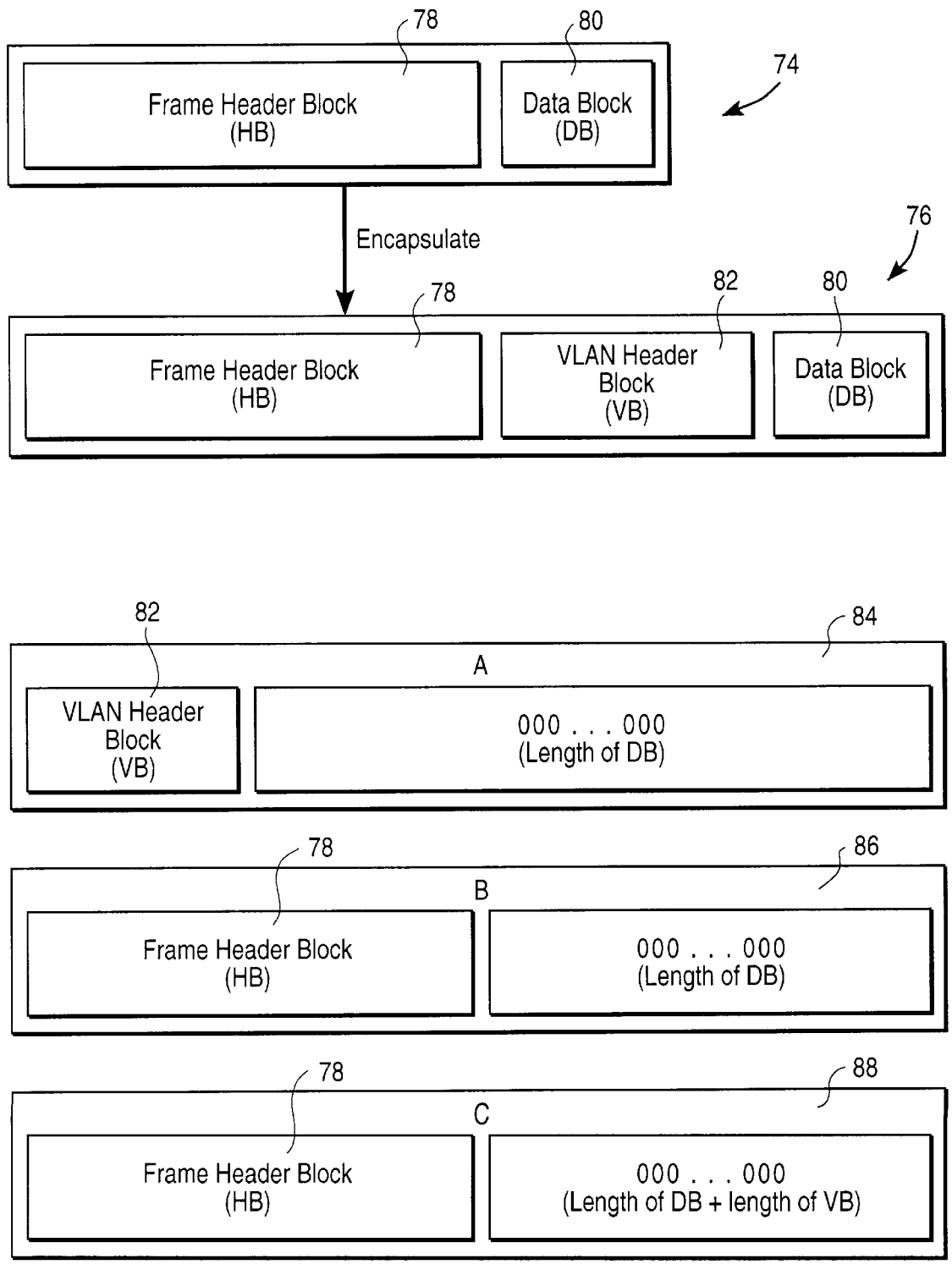
FIG. 5 provides a diagrammatic representation of the encapsulation of an ethernet frame as a VLAN frame, and of three data units which may be generated for the purposes of generating an error detection code, according to the teachings of the present invention.
Figure 6:
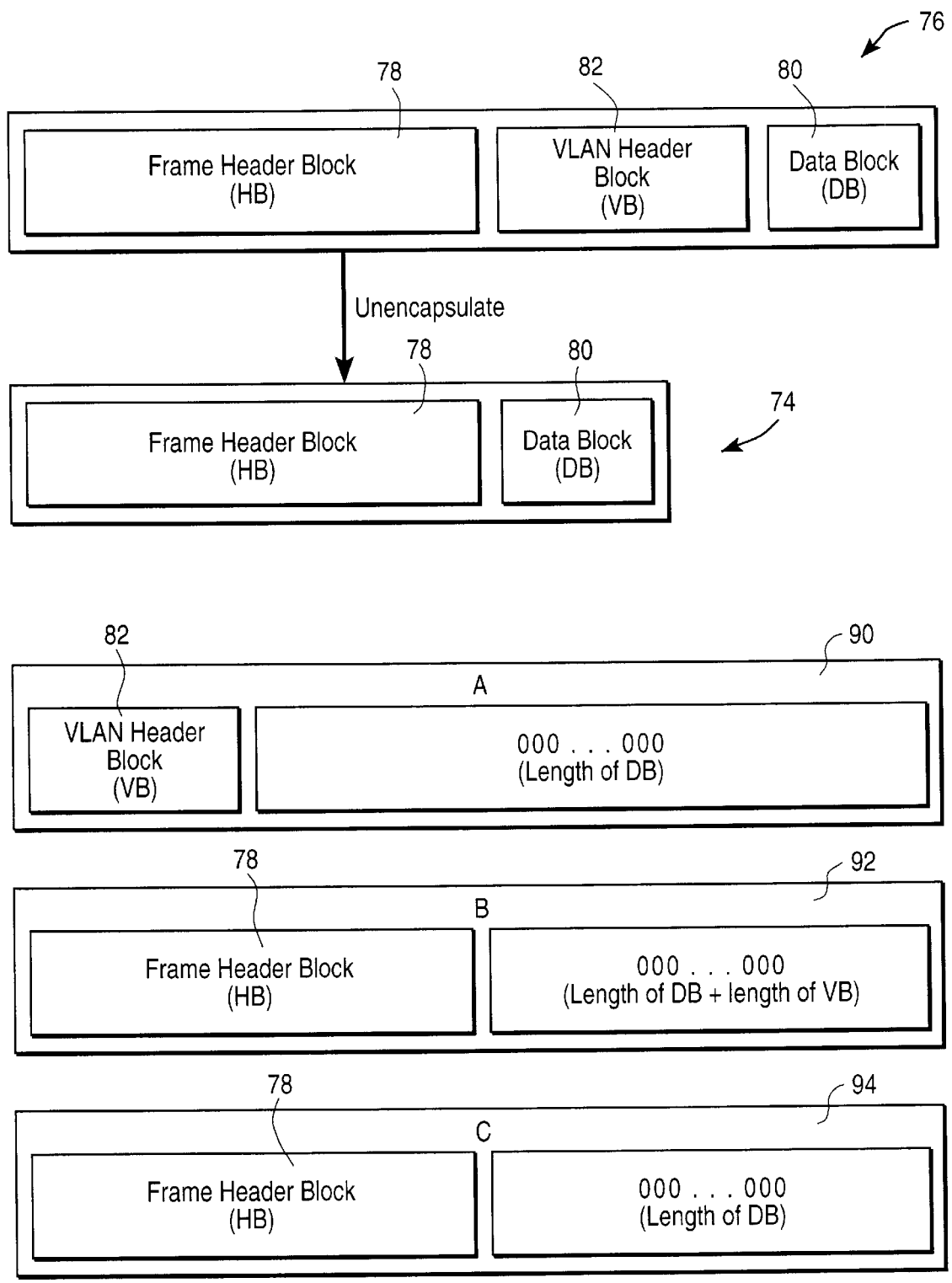
FIG. 6 is a diagrammatic representation showing the unencapsulation of a VLAN frame to reveal an ethernet frame, and of three data units which may be generated for the purposes of calculating an error detection code for the ethernet frame, according to the present invention.

FIGS. 5 and 6 show diagrammatic representations of the modifications made to the contents of a message during exemplary encapsulation and unencapsulation processes respectfully. Specifically, the encapsulation of an ethernet frame 74 as a VLAN frame 76, and the unencapsulation of the VLAN frame 76 to reveal that the ethernet frame 74, are shown. Referring to FIG. 5, the ethernet frame 74 is shown to comprise a frame header block 78 and a data block 80. The frame header block 78 may include, referring to FIG. 1, a preamble 12, a destination address 14, a source address 16 and a length or EtherType value 18. The encapsulation of the ethernet frame 74 requires the insertion of a VLAN header block 82 into the ethernet frame 74, to thereby generate the VLAN frame 76. The VLAN header block 82 may comprise, referring to FIG. 2, the VLAN type code 32 and the VLAN number 34, which together have a bit-length of 32 bits (4 bytes). Accordingly, the insertion of the VLAN header block 82 into the ethernet frame 74 requires that the frame header block 78 be shifted 32 bits to the left.

Similarly, referring to FIG. 6, the unencapsulation of the VLAN frame 76 requires that the VLAN header block 82 be removed therefrom, and that the frame header block 78 be shifted 32 bits to the right to thereby re-generate the original ethernet frame 74.

It will readily be appreciated that the modifications to the ethernet frame 74 and to the VLAN frame 76 that occur during the encapsulation and unencapsulation processes constitute a modification to the message contents. Any error detection code for the messages, generated using the unmodified message content, will be invalid. Accordingly, upon encapsulation and unencapsulation, it is necessary to re-generate an error detection code utilizing the contents of the modified message. For example, referring to FIG. 4, the encapsulation circuitry 72 of the switching hub 70 may be configured to calculate a fresh error detection code for any VLAN messages transversing the switching devices 70. However, simply recalculating an error detection code for the modified message content ignores the possibility that data corruption or modification may have occurred after the error detection code for the unmodified message was generated. For example, referring to the above example given with reference to FIG. 4, the message propagated from the addresser client 68.1 may have been corrupted after transmission from the addresser client 68.1 and prior to reception at the switching hub 70, or within the switching hub 70 itself. Discarding the error detection code generated by the addresser client 68.1 creates the possibility of any such data corruption going undetected upon receipt of the message at the addressee client 68.4.

A further option upon encapsulation of the original message is to retain the original error detection code, and to generate a supplementary error detection code which is incorporated within the encapsulated message. This option, however, has the drawback of increasing the length of the encapsulated message, as additional bytes must be added to the encapsulated message to accommodate the supplementary error detection code. This is undesirable both from transmission and hardware viewpoints.

The present invention proposes a method whereby an original error detection code may be transformed, upon modification of an associated data block comprising a message, to generate a new error detection code for the modified data block that is of the same byte-length as the original error detection code and that further, by utilizing the original error detection code, allows any modifications to the original data block to be detected.

The methodology and apparatus according to the invention require that a fresh error detection code (EDC) for a modified data block be calculated according to the following formula:

$$EDC_{MOD}=EDC_{ORIG}+EDC(A)-EDC(B)+EDC(C) \quad (1)$$

where;
$EDV_{MOD}$ is the error detection code for the modified data block;
$EDV_{ORIG}$ is the error detection code for the original data block;
"A" is a binary data unit comprising the modifying data shifted to a position corresponding to a position thereof in the modified data block;
"B" is a binary data unit comprising original data of the original data block, shifted in the modification process, shifted to a position corresponding to a position thereof in the original data block; and
"C" is a binary data unit comprising the original data, shifted in the modification process, shifted to a position corresponding to a position thereof in the modified data block.

The EDC(A), EDC(B) or EDC(C) value may be calculated, as described above, when required. Alternatively, these values may be pre-calculated and stored in a tabular form where A, B and C are each relatively short and comprise one of a set of known values.

Thus, accordingly to one embodiment of the present invention, the error detection code for the original data block is calculated by adding error detection codes for the above identified data units A and C to, and subtracting an error detection code for the above identified data unit B from, the detection code for the unmodified, original data block. Assuming that the error detection code is algebraic in nature (i.e. the error detection value can be expressed as a polynomial), the above equation (1) can be expressed as follows:

$$EDC_{MOD}=EDC_{ORIG} \oplus EDC(A) \oplus EDC(B) \oplus EDC(C) \quad (2)$$

In other words, the original error detection code can be XORed with error detection codes generated using the above identified data units A, B, and C. The above equation (2) can furthermore be simplified as follows:

$$EDC_{MOD}=EDC_{ORIG} \oplus EDC(A \oplus B \oplus C) \quad (3)$$

According to the above equation (3), the contents of the data units A, B and C are XORed together, resulting in a composite binary value for which the error detection code is calculated. The calculation of the error detection code according to the above equation (3) is particularly advantageous in that an error detection code need only be calculated for a single data unit, namely the result of XORing data units A, B, and C.

Two embodiments of the present invention as described below. Firstly, an embodiment including the modification of the original data block by encapsulation/uncapsulation will be described. Secondly, an embodiment involving the modification of a Time To Live (TTL) variable included within the data portion 20 of an ethernet frame will be described.

Referring now to FIGS. 5, there are shown the three data units A, B, and C which are generated for use in the calculation of an error detection code for the VLAN frame 76. In one embodiment, the error detection code is as Cyclic Redundancy Checksum (CRC). A first data unit 84 (i.e. data unit A) comprises the VLAN header block 82 shifted to the left to a position corresponding to the position of the VLAN header block 82 within the VLAN frame 76. This is achieved by shifting the VLAN header block 82 to the left by a number of bits corresponding to the length of the data block 80, and "padding" the data unit 84 by filling all bits preceding the header block 82 with zeros (0's).

As shown in FIG. 5, to create the VLAN frame 76, the VLAN header block 82 is inserted between two portions of the original contents of the ethernet frame 74, namely the frame header block 78 and the data block 80. Accordingly, to accommodate the VLAN header block 82, a portion of the original contents of the ethernet frame 74, namely the frame header block 78, is shifted to the left by a number of bits corresponding to the bit-length of the VLAN header block 82. A second data unit 86 (i.e. data unit B) comprises the shifted original contents of the ethernet frame 74, namely frame header block 78, shifted to a position corresponding to its position within the original data block, namely the ethernet frame 74. Accordingly, the data unit 86 comprises the frame header block 78 shifted to the left by a number of bits corresponding to the bit-length of the data block 80, with preceding bits within the data unit 86 being padded with zeros. Similarly, a third data unit 88 (i.e. data unit C) comprises the frame header block 78 shifted to a position corresponding to the position of the frame header block 78 in the modified data block, namely the VLAN frame 76. Accordingly, the data unit 88 comprises the frame header block 78 shifted to the left by a number of bits corresponding to the summed lengths of the VLAN header block 82 and the data block 80, with bits preceding the frame header block 78 being padded with zeros.

Having generated the data units 84, 86, and 88, an error detection code, such as a CRC, can be generated for the VLAN frame 76 according to any one of the above equations (1)–(3) by calculating a CRC for each of the data units 84, 86 or 88, or by calculating a CRC for the XORed sum of the data units 84, 86 and 88. FIG. 6 shows three data units 90, 92, and 94 (i.e. data units A, B, and C) that are generated to calculate a CRC for the ethernet frame 74 retrieved from the VLAN frame 76. The first data unit 90 comprises the VLAN header block 82 shifted to a position corresponding to its position within the VLAN frame 76, with preceding bits totaling the length of the data block 80 and being padded with zeros. The second data unit 92 comprises the frame header block 78 shifted to the left to occupy a position corresponding to the position of the frame header block 78 in the VLAN frame 76. The bits preceding the frame header block 78 in the data unit 92 again equal in number the sum of the numbers of bits comprising the data block 80 and the VLAN header block 82, and comprise zeros. The data unit 94 comprises the frame header block 78 shifted to a position corresponding to the position of the frame header block 78 in the ethernet frame 74, with preceding bits equaling the length of the data block 80 in number, and all comprising zeros. The data units 90, 92, and 94 can again be utilized within any of the equations (1)–(3) to calculate an error detection code, such as a CRC, for the ethernet frame 74.

Figure 7A:
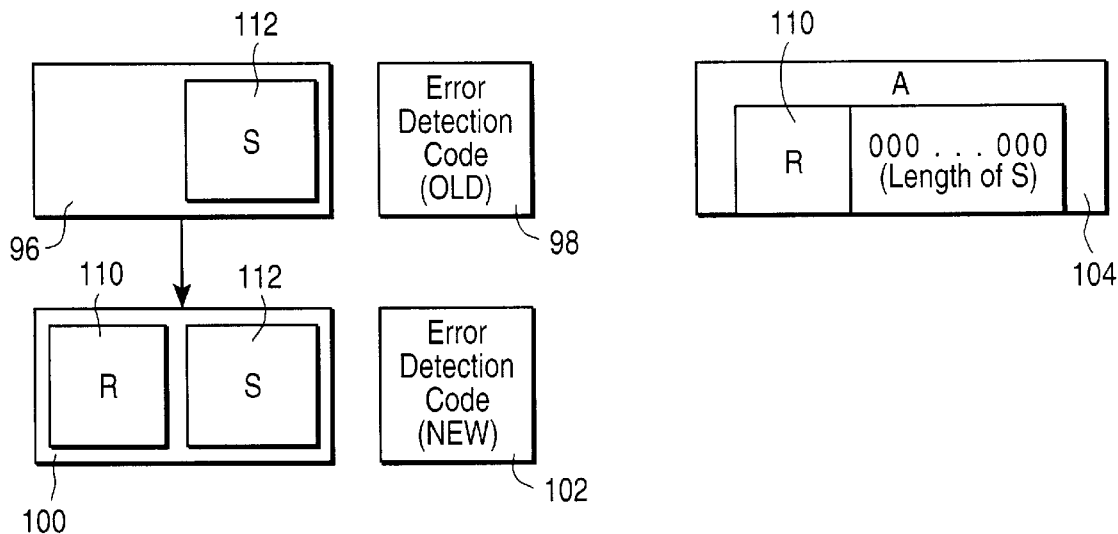
FIGS. 7A–7G each provide a diagrammatic representation of the modification of an original data block to generate a modified data block, and of data units which may be generated for the purposes of calculating an error detection code for the modified data block, according to the teachings of the present invention.
Figure 7B:
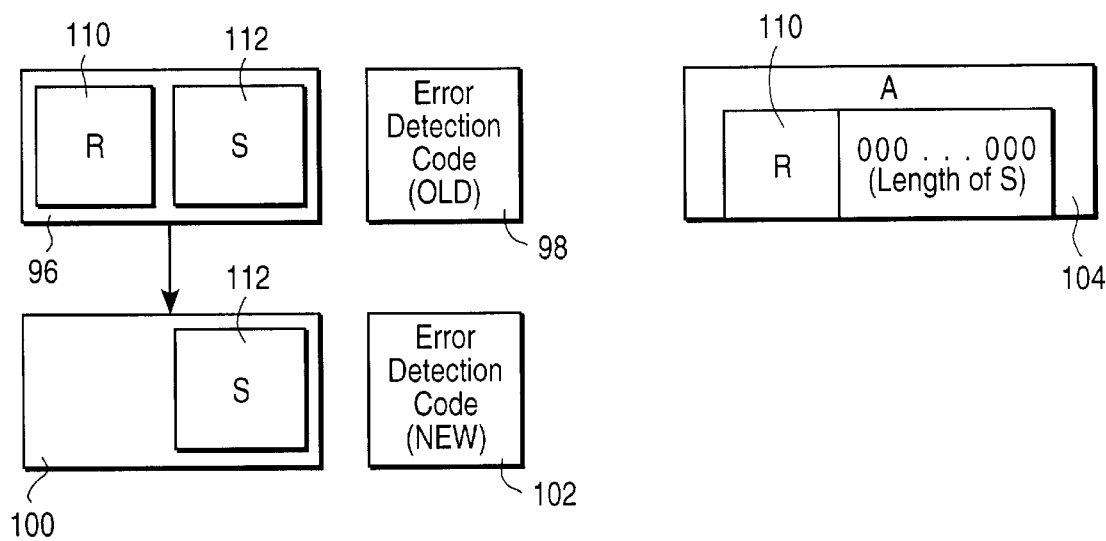

It will of course be appreciated that the above examples, wherein the ethernet frame 74 is encapsulated as a VLAN frame 76, and the VLAN frame 76 is in turn unencapsulated to reveal the ethernet frame 74, merely provide exemplary embodiments of the invention. The teachings of the present invention can be applied in the generation of a updated error detection code upon the modification of any original data block which has an original error detection value associated therewith. FIGS. 7A–7G diagrammatically illustrate generic examples of modifications that may be made to an original data block 96, having an original error detection code 98 associated therewith, to create a modified data block 100, having a modified error detection code 102 associated therewith. Each of FIG. 7A–7G also illustrates which data units A to C must be derived from the data blocks 96 and 100 for the calculation of the modified error detection code 102 according to the above equations (1)–(3). Specifically, FIGS. 7A and 7B illustrate examples wherein the modification to the original data block 96 comprises the addition of modifying data 110 into, or the subtraction of modifying data 110 from, the original data block 96. Here, the modifying data 110 is simply added to or subtracted from an "open-end" or the most significant bits (MSBs) located to the left of original data 112. As is apparent from FIG. 7A and 7B, these modifications require only the generation of a first data unit 104 (i.e. data unit A), as none of the original data within the original data frame 96 is shifted to accommodate the modifying data 110.

Figure 7C:
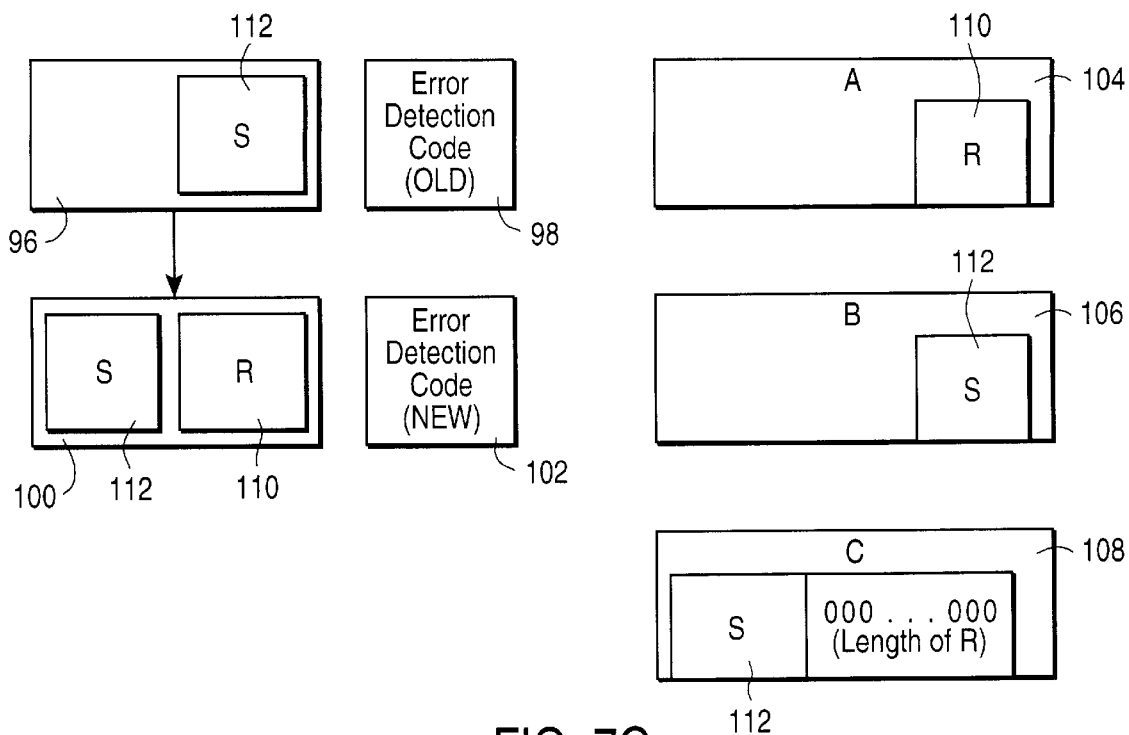
Figure 7D:
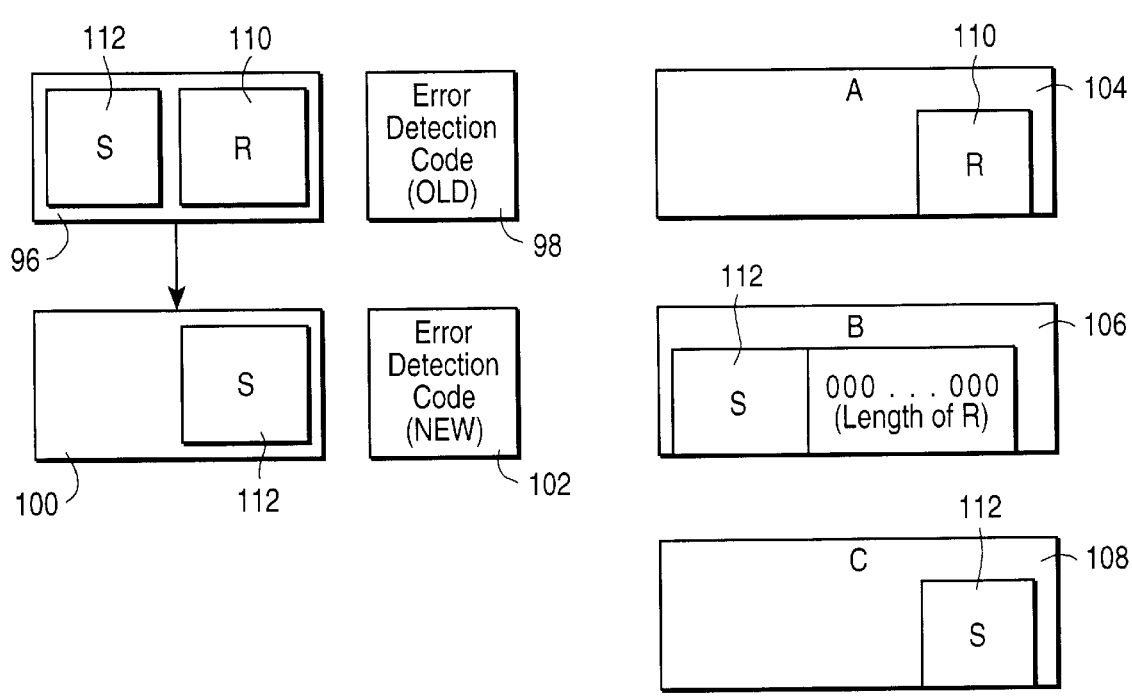

FIGS. 7C and 7D illustrate examples wherein the modifying data 110 is inserted into or subtracted from the beginning, or least significant bits (LSBs), of the original data block 96 to generate the modified data block 100. In each of these cases, the original data 112 must be shifted to the left and right to accommodate the modifying data 110 within the modified data block 100. In each of these cases, three data units 104, 106 and 108 (i.e. data units A, B and C) must be extracted from the original and modified data blocks 96 and 100 for the calculation of a modified error detection code 102, to be associated with the modified data block 100.

Figure 7E:
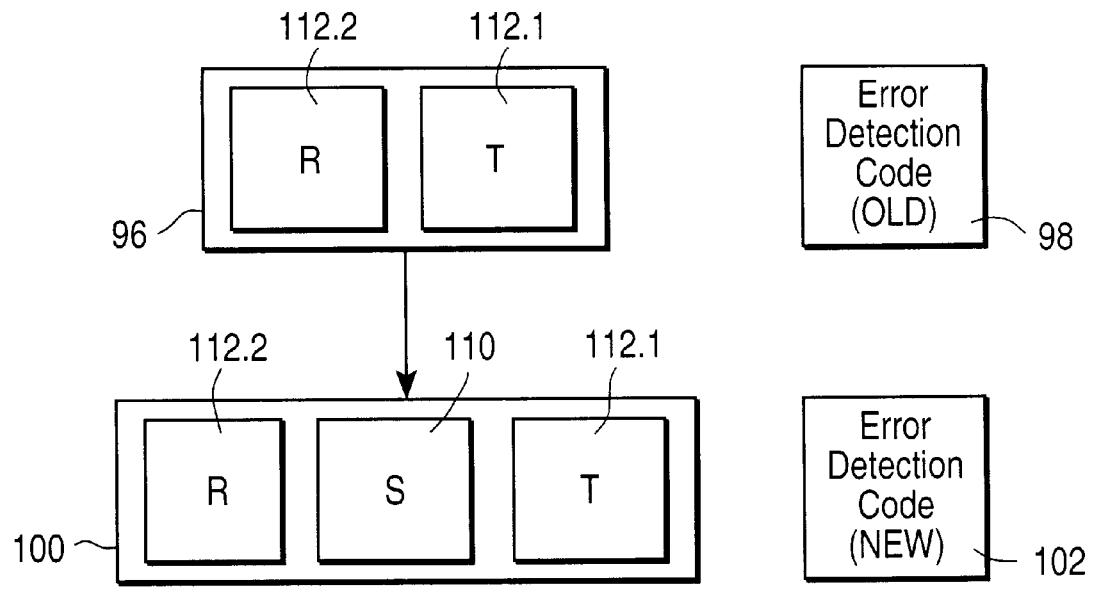
Figure 7E:
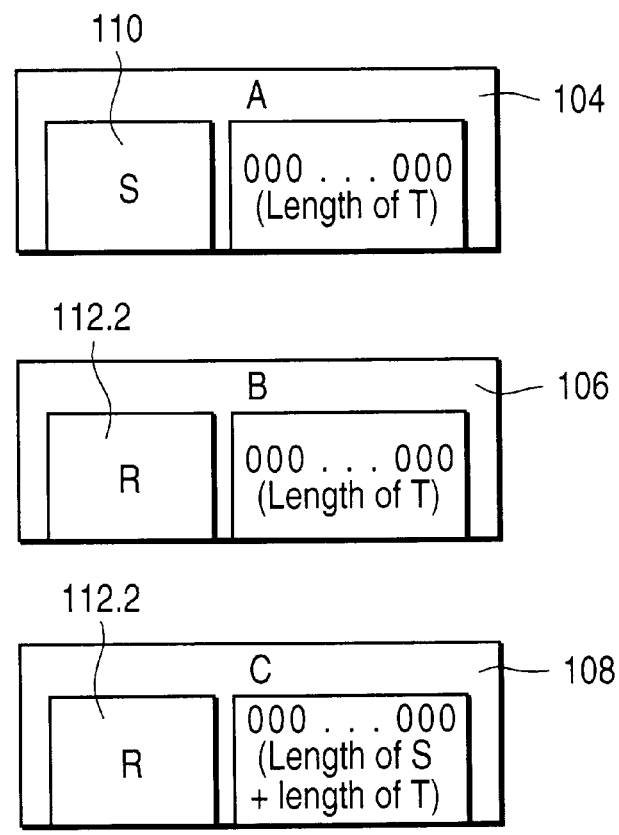
Figure 7F:
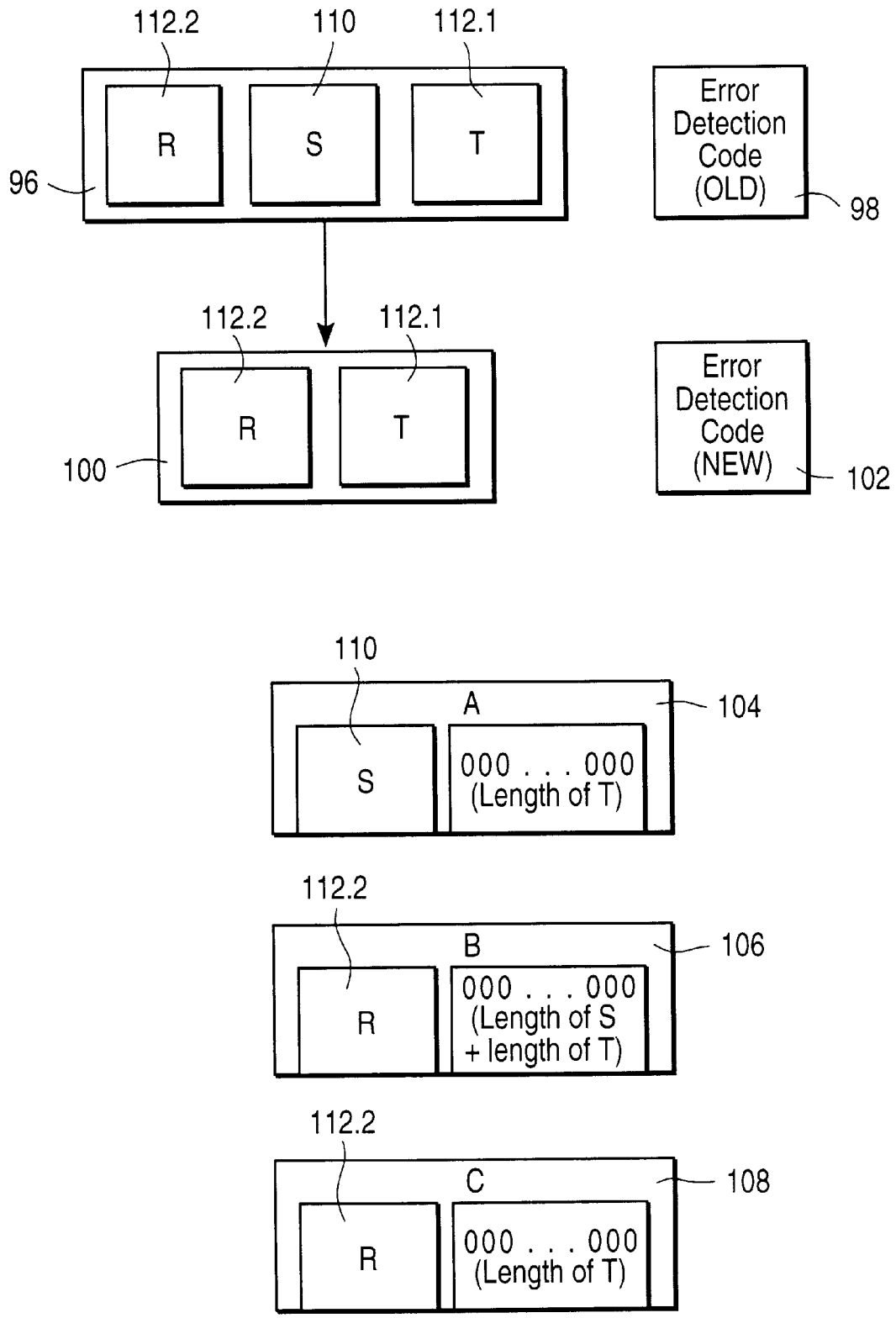
Figure 7G:
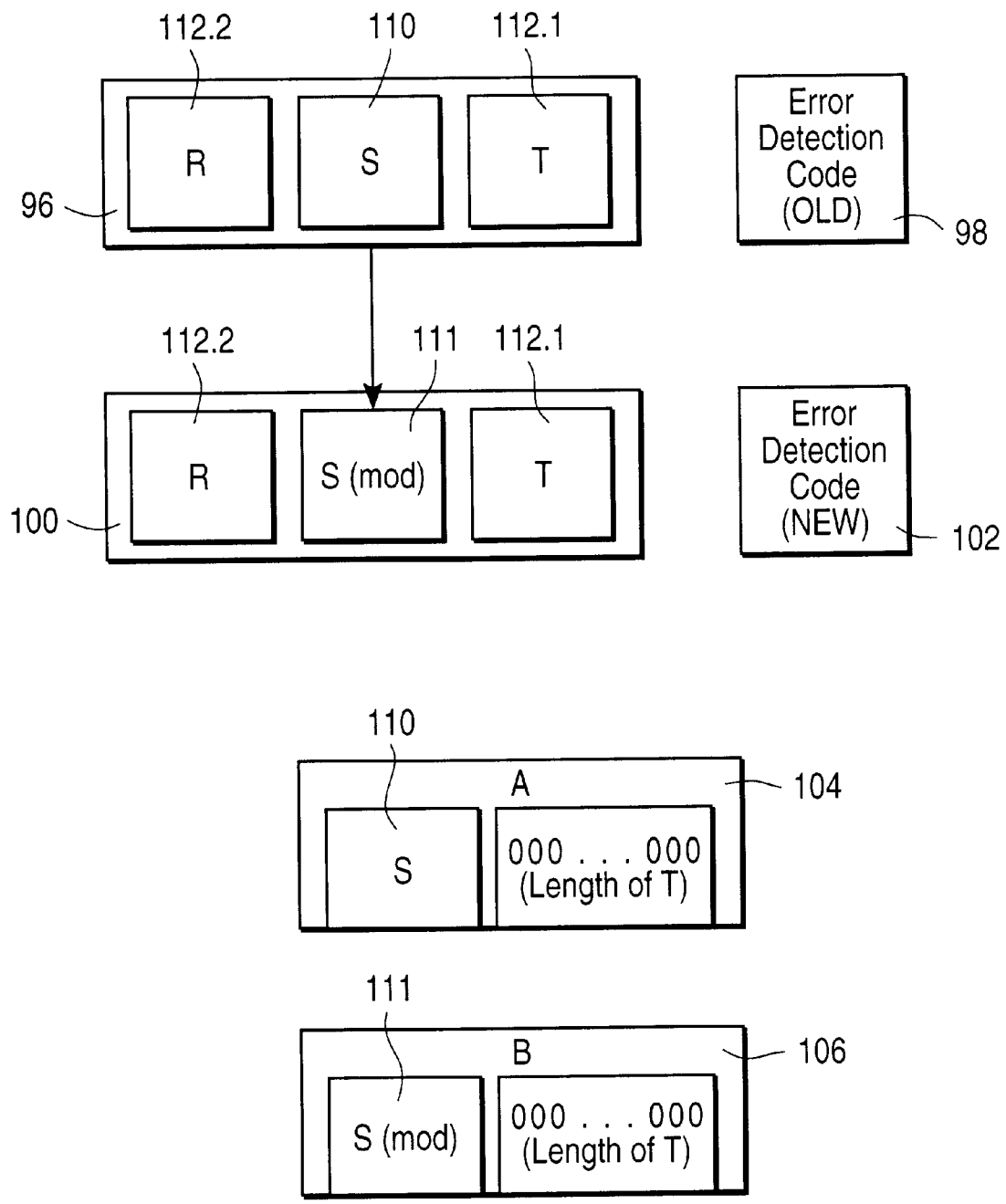

FIGS. 7E–7G illustrate examples wherein the original data block 96 is modified be the insertion of modifying a data 110, or the deletion of modifying a data 110 from, between to portions 112.1 and 112.2 of original data within the original data block 96. As each of these operations require the shifting of the original data portion 112.2 to the left or right, it is in these cases necessary to extract three data units 104, 106 and 108 (i.e. data units A, B and C) to be utilized within any of the above equations (1)–(3) for the calculation of the modified error detection code 102. FIG. 7G illustrates the example in which, as opposed to the insertion or deletion of modifying data 110, the modifying data 110 is simply modified without an alteration in the bit length thereof. In this example a data unit 114, which may be labeled data unit B for use in the above equations (1)–(3), is generated.

In a second specific embodiment of the present invention, the original data block 110 is a Time To Live (TTL) variable, which comprises a 8-bit binary sequence in the data portion 20 of an ethernet frame. The TTL variable is used to remove "old" ethernet frames, from a network. On generation of an ethernet frame, the TTL variable thereof is set to a predetermined value (e.g. five), which is decremented each time the relevant frame traverses a router. When the TTL value reaches a predetermined minimum value (e.g. zero), the frame is regarded as being obsolete, and removed from the network. This prevents a network from being congested with old frames.

As a CRC for such an ethernet frame was calculated using the original contents of the frame, it will be appreciated that by decrementing the TTL value, the original CRC is invalidated. Accordingly, after the TTL value has been decremented at each router the frame traverses, it becomes necessary to regenerate a CRC for the modified frame. This can be done by generating error detection values for data units 104 and 106 shown in FIG. 7G, where data block 110 comprises the original TTL value and data block 111 comprises the decremental TTL value. Further, as both the original and decremental TTL values comprise part of a set of known values (e.g. between zero and five) it may be expeditious to pre-calculate error detection values for each of the possible TTL values, which are then stored in a table. This table may then be referenced when required to obtain the error detection value for a specific TTL value, which is then used as described above to generate a CRC for the modified ethernet frame. By pre-calculating the error detection values for a known range of TTL values, the generation of the new CRC is expedited, and the circuitry for the generation thereof may be simplified.

Figure 8:
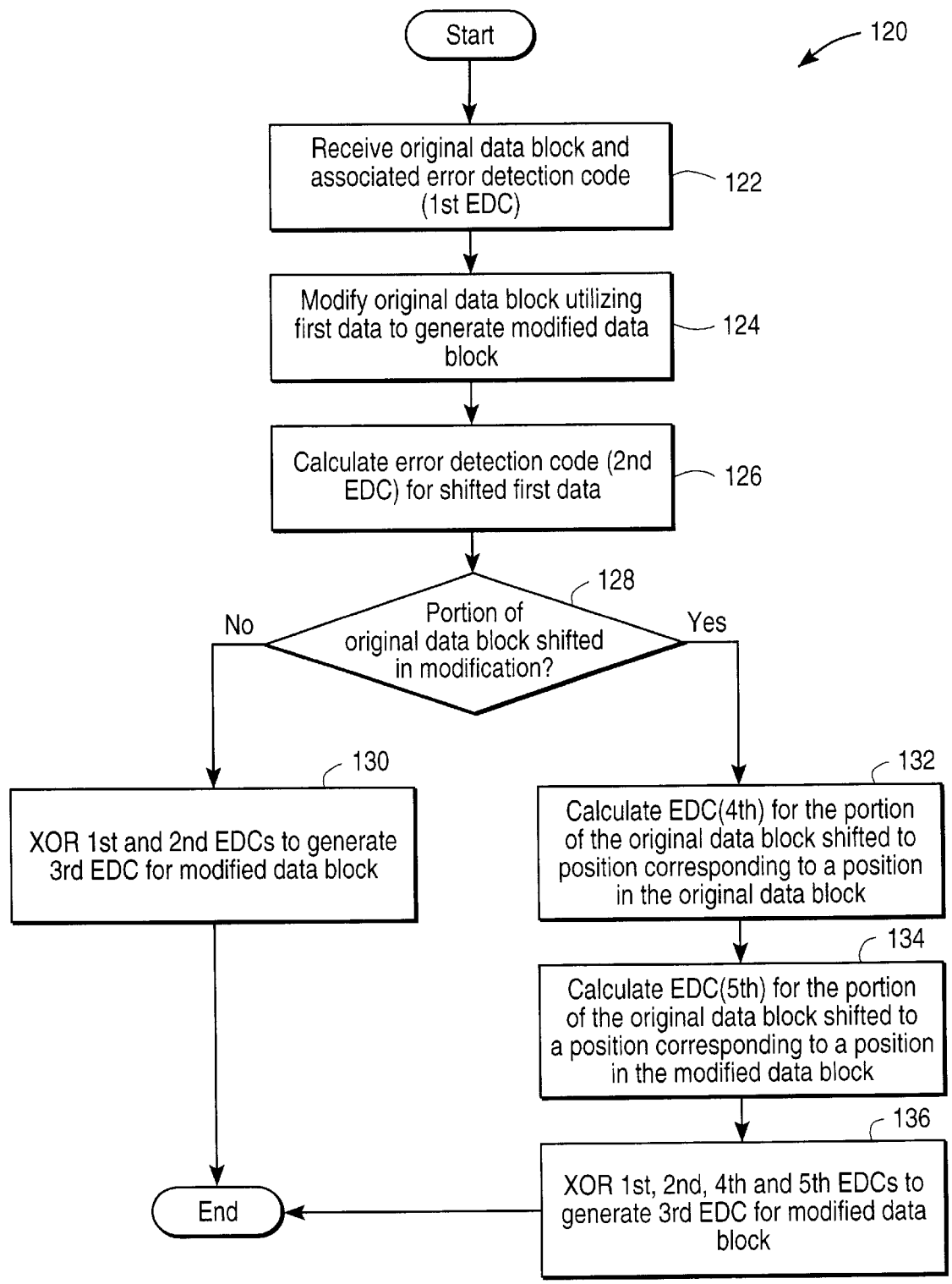
FIG. 8 is a flow chart illustrating a first embodiment of a method, according to the invention, of generating an error detection value for a modified data packet.

FIG. 8 shows one embodiment of a computer-implemented method 120 of generating an error detection code for a modified binary data block. At step 122, an original data block, for example an unencapsulated frame or the frame including the original TTL, is received together with an associated error detection code, for example a CRC. At step 124, the original data block is modified utilizing first data, to generate a modified data block. For example, the modifying first data may be header information which is either inserted into, or extracted from, the original data block to thereby encapsulate, or unencapsulate, the original data block. Alternatively, the modifying data may be a decremental TTL value. The method 120 then proceeds to step 126, at which an error detection code, such as a CRC, is generated or obtained from a table for the first data which, in the above encapsulation/unencapsulated example, comprises header information. In the case of encapsulation in which the header information is inserted into the original data block, the calculation of the CRC at steps 126 requires that the header information to be shifted to a position corresponding to its position within the modified data block. Alternatively, should the header information be removed from the original data block, the CRC at step 126 is calculated for the header information shifted to a position corresponding to its position in the original data block.

At decision block 128, a determination is made as to whether any portion of the contents of the original data block was shifted to the left or to the right in order to facilitate the modification that occurred at step 124. If it is determined at decision block 128 that no portion of the contents of the original data block was shifted, the method proceeds to step 130 in which the CRCs for the original data block and the header information are XORed to generate a CRC for the modified data block. Alternatively, if it is determined at decision block 128 that a portion of the contents of the original data block was shifted at step 124, the method proceeds to calculate error detection codes for the shifted portion of the original data block, shifted to positions corresponding to:

1. a position occupied by the shifted contents in the original data block (at step 132); and
2. a position occupied by the shifted data portion in the modified data block (at step 134).

At step 136, the CRCs generated at steps 126, 132 and 134 are XORed together to calculate a CRC for the modified data block. Where the modified or modifying data comprise one of a known set of values, the CRC generated at step 126 may simply be retrieved from a table of pre-calculated CRC values.

Figure 9:
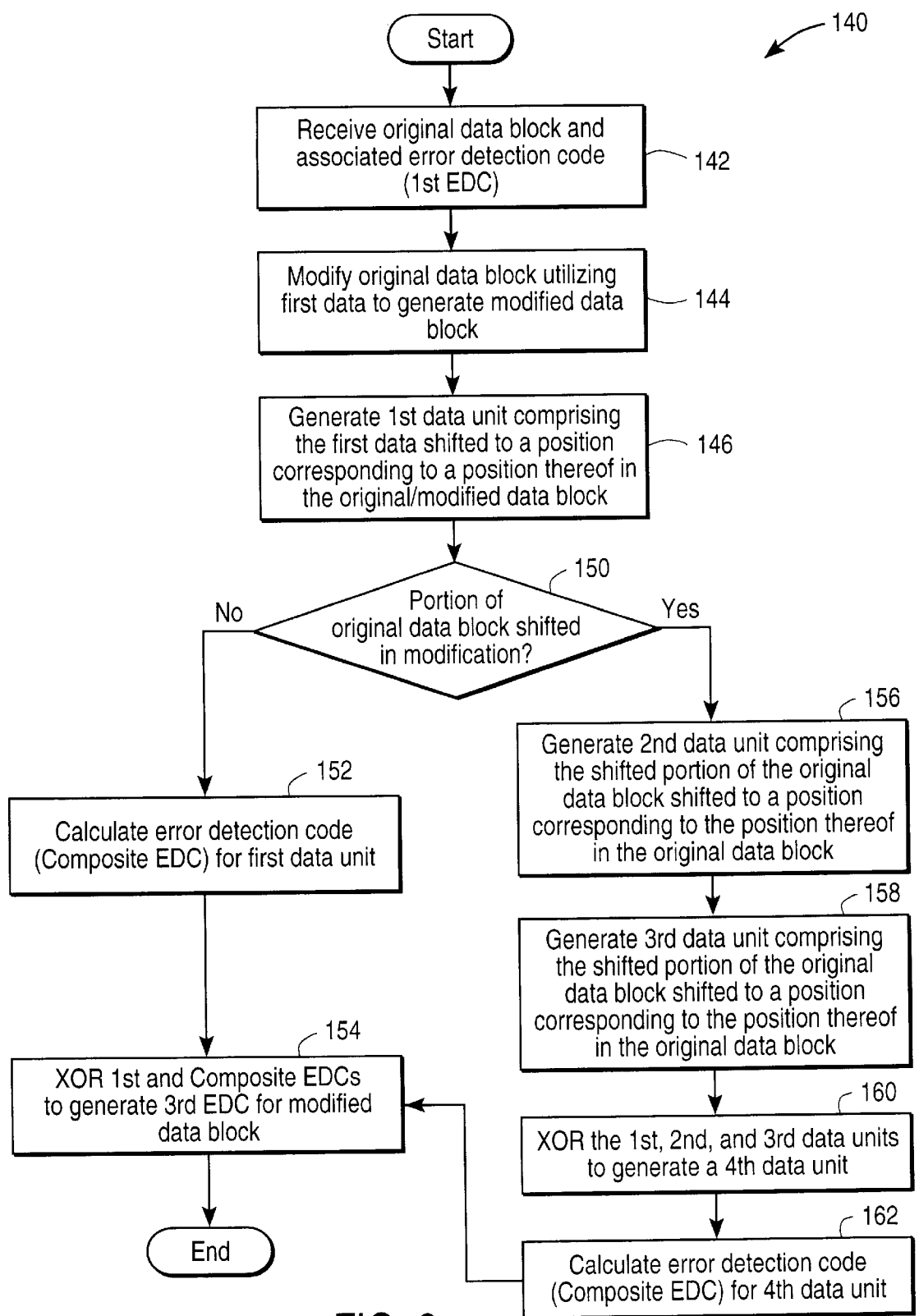
FIG. 9 is a flow chart illustrating a second embodiment of a method, according to the invention, of generating an error detection value for a modified data packet.

FIG. 9, shows a flow chart illustrating an alternative method 140, according to the invention, of generating an error detection value, such as CRC, for a modified data block. At step 142, the original data block and an error detection code, in the form of a CRC, are received. At step 144 the original data block is modified using first data, in the form of header information, to generate a modified data block by either encapsulating or unencapsulating the original data block. At step 146, the first data unit is derived from the original or modified data block, depending on whether encapsulation or unencapsulation occurred at step 144. The first data unit comprises the header information shifted to a position corresponding to the position of the header information in either the original or modified data block. At decision block 150, a determination is made as to whether any portion of the contents of the original data block was shifted at step 144 to facilitate the modification. If not, an composite error detection code (in the form of a CRC) is generated for the first data unit at step 152. The method 140 then proceeds to step 154, at which the CRC for the original data block and the composite CRC are XORed together to generate a CRC for the modified data block.

On the other hand, should it be determined at decision block 150 that a portion of the contents of the original data block was shifted to accommodate the modifications, method 140 proceeds to step 156, at which a second data unit is generated. The second data unit comprises the shifted portion of the original data block shifted to a position corresponding to the position thereof in the original data block. At step 158, a third data unit is generated, the third data unit comprising the shifted portion of the original data block shifted to a position corresponding to the position thereof in the modified data block. At step 160, the first, second and third data units are XORed together to generate a fourth data unit. At step 162, a composite CRC is generated for the fourth data unit. The method 140 then proceeds to step 154, at which the CRC for the original data block, and the composite CRC, are XORed together to generate a CRC for the modified data block.

Figure 10:
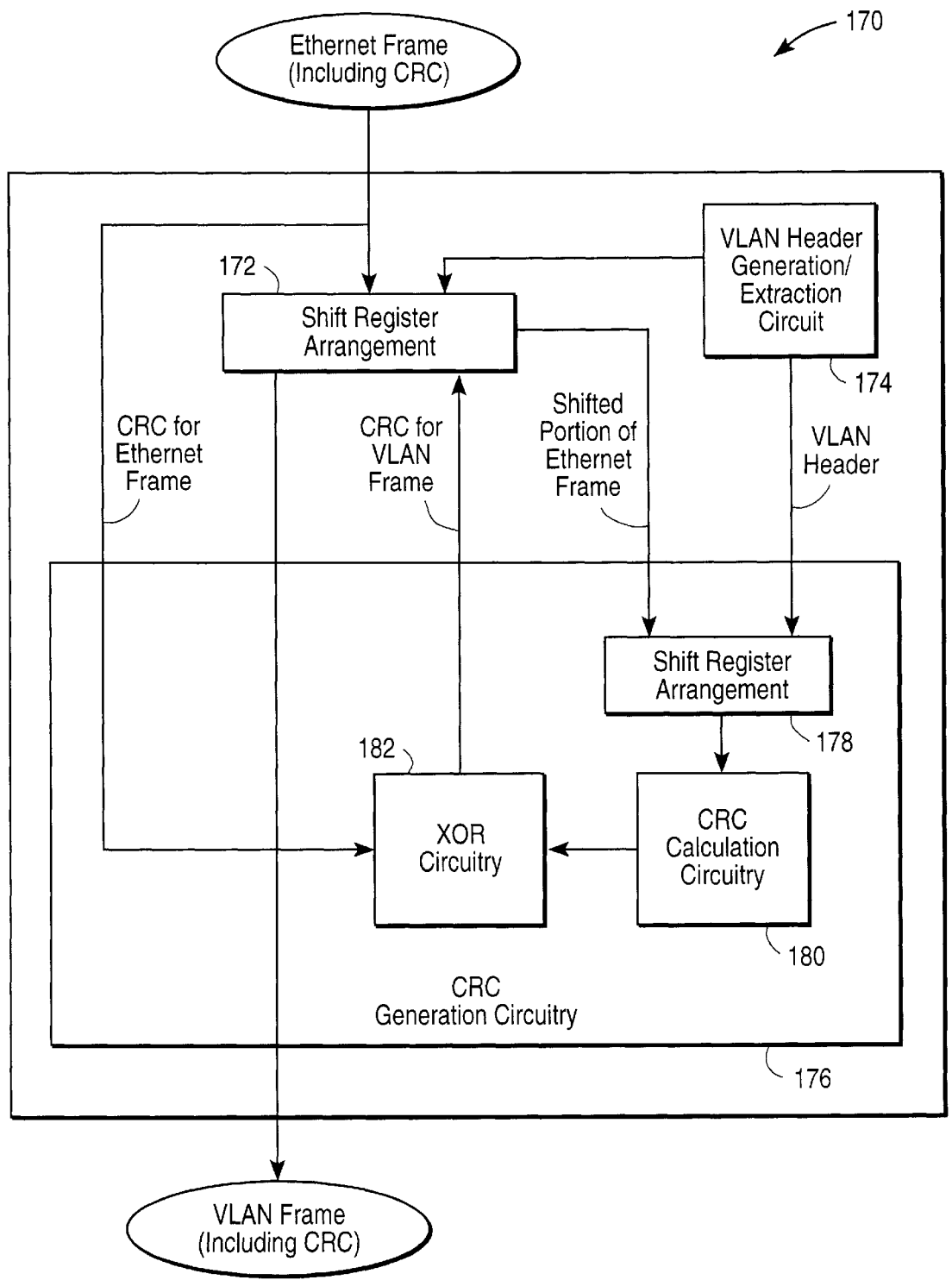
FIG. 10 is a diagrammatic representation of encapsulation/unencapsulation circuitry, according to the invention, for encapsulating an exemplary ethernet frame as VLAN frame, and for unencapsulating a VLAN frame to reveal an ethernet frame.

The exemplary methods 120 and 140 discussed above with reference to FIGS. 8 and 9 can be implemented in either software or hardware. FIG. 10 shows an exemplary embodiment of encapsulation/unencapsulation circuitry 170, which may be employed within a network device (such as a switching hub, router bridge or server) to encapsulate/unencapsulate data packets traversing the relevant network device. The functioning of the circuitry 170 will be discussed with reference to the encapsulation of an ethernet frame, having an original CRC associated therewith, to generate a VLAN frame, having a modified CRC associated therewith. It will be appreciated that the circuitry 170 could be utilized to encapsulate any original data packet, formatted according to a first protocol, as a modified message packet, corresponding to a second protocol. The circuitry 170 comprises a shift register arrangement 172, into which the ethernet frame is received. The shift register 172 is coupled to a VLAN header generation/extraction circuit 174, which examines the contents of the shift register 172, and either inserts appropriate VLAN header information into, or extracts VLAN header information from, the received packet. In the present example, the generation/extraction circuit 174 inserts appropriate VLAN header information into the ethernet frame by shifting the ethernet frame header block 4 bytes to the left, and inserting the appropriate VLAN header information between the ethernet frame header and the data portions of the ethernet frame, as discussed above. The ethernet frame further includes a CRC, generated by an addresser client, which must be updated in view of the modification to the ethernet frame. Accordingly, the encapsulation/unencapsulation circuitry 170 includes CRC generation circuitry 176 which is configured to retrieve appropriate information from the shift register arrangement 172 and the generation/extraction circuit 174, and to generate an updated CRC, in accordance with the teachings of the present invention, to be included in the VLAN frame. The CRC generation circuitry 176 includes a shift register arrangement 178, which is coupled to receive the inserted VLAN header information from the VLAN header generation/extraction circuit 174, and to generate a first data unit comprising VLAN header information shifted to a position corresponding to the position of the VLAN header information within the VLAN frame. This first data unit is then propagated to CRC calculation circuitry 180, where a CRC is calculated, and forwarded to XOR circuitry 182. The shift register arrangement 178 is furthermore coupled to the shift register arrangement 172 to receive a shifted portion of the original ethernet frame. The shift register arrangement 178 then generates second and third data units which are propagated to the CRC calculation circuitry 180. Specifically, the shift register arrangement 178 generates a second data unit comprising the shifted portion of the ethernet frame, shifted to a position corresponding to the position thereof in the ethernet frame. The shift register arrangement 178 also generates the third data unit comprising the shifted portion of the ethernet frame, shifted to a position corresponding to a position thereof in the VLAN frame. The CRC calculation circuitry 180 then calculates a CRC for each of the second and third data units, which are both propagated to the XOR circuitry 182. The XOR circuitry 182 is also coupled to receive the CRC associated with the original ethernet frame. Accordingly, the XOR circuitry 182 receives the CRC for the original ethernet frame, and the CRC's for the first, second and third data units. These four CRC's are then XORed together to generate a CRC for the VLAN frame, which is propagated from the XOR circuitry 182 to the shift register arrangement 172 for inclusion within the VLAN frame. Once the updated CRC, which has the byte-length equal to that of the CRC for the ethernet frame, has been included in the VLAN frame, the VLAN frame is broadcast from the encapsulation/unencapsulation circuitry 170.

In an alternative embodiment, the CRC calculation circuitry 180 may be configured to XOR the first, second and third data units to generate a composite data unit, and then merely calculate a CRC for the this composite data unit. The CRC for the composite data unit may then be XORed by the XOR circuitry 182 with the CRC for the ethernet frame to generate the CRC for the VLAN frame.

Figure 11:
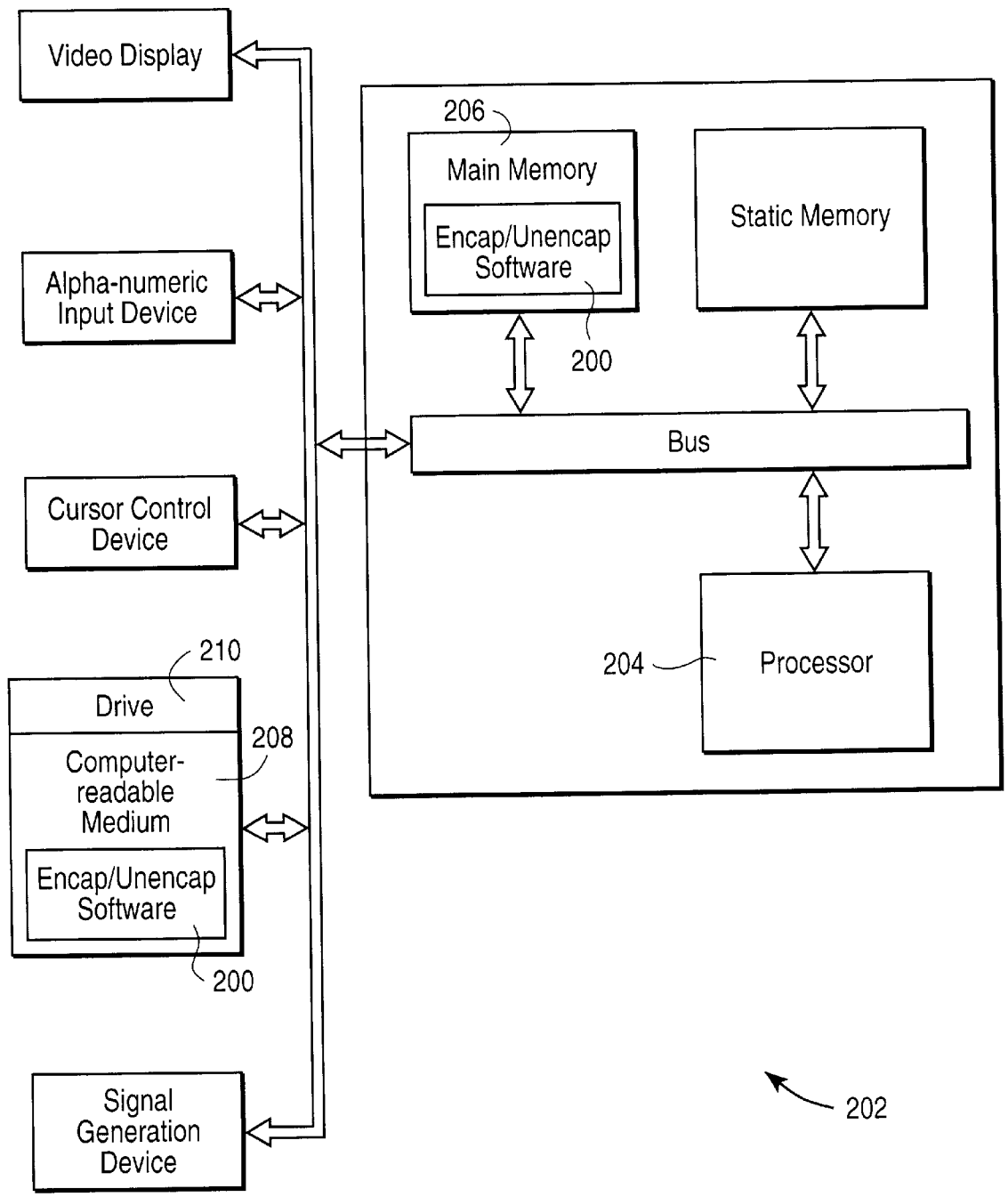
FIG. 11 is a diagrammatic representation of a network device incorporating a computer-readable medium on which is stored a computer program, comprising a set of instructions for executing the steps comprising the methods illustrated in FIGS. 8 and 9.

As mentioned above, the present invention may also be implemented in software. FIG. 11 shows a network device 202, which may for example comprise a switching hub, within which encapsulation/unencapsulation software 200 is stored, the encapsulation/unencapsulation software 200 embodying the methodology described above with reference to FIGS. 8 and 9. The various steps of the methodology according to the invention may be performed by a processor 204 included within the network device 202 under the direction of a set of instructions incorporated within the encapsulation/unencapsulation software 200. During execution, the encapsulation/unencapsulation software 200 at least partially resides in a main memory 206 of the network device 202, as shown in FIG. 11. The encapsulation/unencapsulation software 200 may also reside upon a computer-readable medium 208 (such as a magnetic tape or disk, or an optical disk), within a drive unit 210. The drive unit 210 is capable of reading the sequence of instructions which comprises the encapsulation/encapsulation software 200 from the computer-readable medium 208 and then propagating these instructions to the main memory 206 and/or to the processor 204. For the purposes of the specification, the term "computer-readable medium" shall be taken to include any storage or memory resource capable of storing a computer program.

In alternative embodiments, the present invention may be applicable to implementations of the invention in integrated circuits or chipsets, wireless implementations, switching system products and transmission systems products. For the purposes of this application, the term switching system products shall be taken to mean private branch exchanges (PBXs), central office switching systems that interconnect subscribers, toll/tandem switching systems for interconnecting trunks between switching centers and broad band core switches found at the center of a service provider's network that may include broad band edge switches or access multiplexers and associated signaling and support systems and services. The term transmission systems products shall be taken to mean products used by service providers to provide interconnection between their subscribers and their network, such as loop systems, and which provide multiplexing, aggregation and transport between a service provider's switching systems across a wide area and associated signaling and support systems and services.

Thus, a method and apparatus for generating an error detection code for a modified data packet, derived from an original data packet having an error detection code associated therewith, have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A computer-implemented method of generating an error detection code for a modified binary data block, the modified data block being derived from an original binary data block having a first error detection code associated therewith, the method comprising the steps of:

modifying the original data block utilizing first data to generate the modified data block;

calculating a second error detection code for the first data; and adding the first and second error detection codes so as to generate a third error detection code for the modified data block.

2. The computer-implemented method of claim 1 wherein the first and second error detection codes are binary values, and the step of adding comprises XORing the first and second error detection codes.

3. The computer-implemented method of claim 1 wherein the third error detection code is a binary value and has a bit-length equal to that of the first error detection code.

4. The computer-implemented method of claim 1 wherein the second error detection code is pre-calculated prior to the modification of the original data block.

5. The computer-implemented method of claim 1 wherein the step of modifying comprises inserting the first data into the original data block to generate the modified data block, and the step of calculating comprises calculating the second error detection code for the first data shifted to a position corresponding to its position within the modified data block.

6. The computer-implemented method of claim 1 wherein the step of modifying comprises removing the first data from the original data block to generate the modified data block, and the step of calculating comprises calculating the second error detection code for the first data shifted to a position corresponding to its position within the original data block.

7. The computer-implemented method of claim 1 wherein the step of modifying comprises shifting second data from an original position within the original data block to a modified position within the modified data block, the method including the steps of:

calculating a fourth error detection code for the second data shifted to a position corresponding to the original position thereof within the original data block;

calculating a fifth error detection code for the second data shifted to a position corresponding to the modified position thereof within the modified data block; and XORing the first, second, fourth and fifth error detection codes to generate the third error detection code for the modified data block.

8. The computer-implemented method of claim 1 wherein the step of modifying comprises shifting second data from an original position within the original data block to a modified position within the modified data block, the method including the steps of:

generating a first data unit comprising the first data shifted to a position corresponding to a position thereof in either the original or modified data blocks;

generating a second data unit comprising the second data shifted to a position corresponding to the original position thereof within the original data block;

generating a third data unit comprising the second data shifted to a position corresponding to the modified position thereof within the modified data block;

XORing the first, second and third data units to generate a fourth data unit;

calculating a composite error detection code for the fourth data unit; and adding the composite and first error detection codes to generate a third error detection code for the modified data block.

9. The computer-implemented method of claim 1 wherein the step of modifying the original data block comprises encapsulating the original data block.

10. The computer-implemented method of claim 9 wherein the step of encapsulating comprises encapsulating the original data block as a virtual local area network (VLAN) frame.

11. The computer-implemented method of claim 1 wherein the original data block comprises an ethernet frame.

12. The computer-implemented method of claim 1 wherein the step of modifying the original data block comprises unencapsulating the original data block.

13. The computer-implemented method of claim 12 wherein the step of unencapsulating comprises unencapsulating a virtual local area network (VLAN) frame.

14. The computer-implemented method of claim 1 wherein the original data block comprises a VLAN frame.

15. The computer-implemented method of claim 1 wherein the first error detection code is a checksum.

16. The computer-implemented method of claim 15 wherein the checksum is a cyclic redundancy checksum (CRC).

17. The computer-implemented method of claim 1 wherein the first error detection code is a frame check sequence (FCS).

18. A computer-implemented method of generating an error detection code for a modified data block, the modified data block being derived from an original data block having a first error detection code associated therewith, the method comprising the steps of:

modifying the original data block by inserting first data into the original data block to generate the modified data block;

calculating a second error detection code for the first data shifted to a position corresponding to the position thereof in the modified data block; and adding the first and second error detection codes so as to generate a third error detection code for the modified data block.

19. The computer-implemented method of claim 18 wherein the first and second error detection codes are binary values, and the step of adding comprises XORing the first and second error detection codes.

20. The computer-implemented method of claim 18 wherein the third error detection code has a bit-length equal to that of the first error detection code.

21. A computer-implemented method of generating an error detection code for a modified data block, the modified data block being derived from an original data block having a first error detection code associated therewith, the method comprising the steps of:

modifying the original data block by deleting first data from the original data block to generate the modified data block;

calculating a second error detection code for the first data shifted to a position corresponding to the position thereof in the original data block; and subtracting the first and second error detection codes so as to generate a third error detection code for the modified data block.

22. The computer-implemented method of claim 21 wherein the first and second error detection codes are binary values, and the step of subtracting comprises XORing the first and second error detection codes.

23. The computer-implemented method of claim 21 wherein the third error detection code has a bit-length equal to that of the first error detection code.

24. A computer-implemented method of encapsulating a data packet, having a first cycle redundancy checksum (CRC) associated therewith, with virtual local area network (VLAN) header information, the method including the steps of:

inserting the VLAN header information into the data packet to generate an encapsulated frame;

generating a first data unit comprising the VLAN header information shifted to a position corresponding to the position of the VLAN header in the encapsulated frame;

calculating a second CRC for the first data unit; and

XORing the first and second CRCs to generate a third CRC associated with the encapsulated frame.

25. The computer-implemented method of claim 24 including the steps of:

shifting a displaced portion of the data packet to accommodate the insertion of the VLAN header information into the data packet;

generating a second data unit comprising the displaced portion of the data packet shifted into a position corresponding to the position of the displaced portion in the data packet;

calculating a fourth CRC for the second data unit;

generating a third data unit comprising the displaced portion of the data packet shifted into a position corresponding to the position of the displaced portion in the encapsulated frame;

calculating a fifth CRC for the third data unit; and

XORing the first, second, fourth and fifth CRCs to generate the third CRC associated with the encapsulated frame.

26. A computer-implemented method of unencapsulating an encapsulated data packet, having a first cycle redundancy check (CRC) associated therewith, by removing virtual local area network (VLAN) header information therefrom to generate an unencapsulated data packet, the method including the steps of:

removing the VLAN header information from the encapsulated data packet;

generating a first data unit comprising the VLAN header information shifted into a position corresponding to the position of the VLAN header information in the encapsulated data packet;

calculating a second CRC for the first data unit; and

XORing the first and second CRCs to generate a third CRC associated with the unencapsulated data packet.

27. The computer-implemented method of claim 26 including the steps of:

shifting a displaced portion of the encapsulated data packet to accommodate the removal of the VLAN header information therefrom;

generating a second data unit comprising the displaced portion shifted into a position corresponding to the position of the displaced portion in the encapsulated data packet;

calculating a fourth CRC for the second data unit generating a third data unit comprising the displaced portion shifted into a position corresponding to the position of the displaced portion in the unencapsulated data packet;

calculating a fifth CRC for the third data unit; and

XORing the first, second, fourth and fifth CRCs to generate the third CRC associated with the unencapsulated data packet.

28. Apparatus for generating an error detection code for a modified data block, the modified data block being derived from an original data block having a first error detection code associated therewith, the apparatus comprising:

a first circuit configured to calculate a second error detection code for first data utilized to generate the modified data block from the original data block; and a second circuit configured to XOR the first and second error detection codes so as to generate a third error detection code for the modified data block.

29. The apparatus of claim 28 comprising a third circuit configured to modify the original data block by shifting second data from an original position within the original data block to a modified position within the modified data block, and wherein the first circuit is configured to calculate a fourth error detection code for the second data shifted to a position corresponding to the original position within the original data block, and to calculate a fifth error detection code for the second data shifted to a position corresponding to the modified position within the modified data block, and wherein the second circuit is configured to XOR the first, second, fourth and fifth error detection codes to generate the third error detection code for the modified data block.

30. The apparatus of claim 28 comprising:

a third circuit configured to modify the original data block by shifting second data from an original position within the original data block to a modified position within the modified data block, so as to allow the first data to be accommodated in the modified data block;

a fourth circuit configured to generate:
    a first data unit comprising the first data shifted to a position corresponding to a position thereof in either the original or modified data block;
    a second data unit comprising the second data shifted to a position corresponding to the original position thereof within the original data block; and
    a third data unit comprising the second data shifted to a position corresponding to the modified position thereof within the modified data block.

31. The apparatus of claim 30 including a fifth circuit configured to XOR the first, second and third data units to generate a fourth data unit, and wherein the first circuit is configured to calculate a composite error detection code for the fourth data unit, and wherein the second circuit is configured to add the composite and first error detection codes to generate the third error detection code for the modified data block.

32. The apparatus of claim 30 wherein the first circuit is configured to calculate an error detection code for each of the first, second and third data units, and the second circuit is configured to XOR the error detection codes for each of the first, second and third data units to generate the third error detection code.

33. The apparatus of claim 30 wherein the third circuit is configured to modify the original data block by inserting the first data into the original data block, and wherein the first circuit is configured to calculate the second error detection code for the first data shifted to a position corresponding to its position in the modified data block.

34. The apparatus of claim 30 wherein the third circuit is configured to modify the original data block by removing the first data from the original data block, and wherein the first circuit is configured to calculate the second error detection code for the first data shifted to position corresponding to its position in the original data block.

35. The apparatus of claim 30 wherein the third circuit is configured to modify the original data block by encapsulation of the original data block.

36. The apparatus of claim 35 wherein the third circuit is configured to encapsulate the original data block as a VLAN frame.

37. The apparatus of claim 30 wherein the third circuit is configured to modify the original data block by unencapsulation of the original data block.

38. The apparatus of claim 28 wherein the first error detection code is a checksum.

39. The apparatus of claim 38 wherein the checksum is a cyclic redundancy checksum (CRC).

40. The apparatus of claim 28 wherein the first error detection code is a frame check sequence (FCS).

41. The apparatus of claim 28 wherein the apparatus comprises a switching system product.

42. The apparatus of claim 28 wherein the apparatus comprises a transmission system product.

43. A computer-readable medium having stored thereon at sequence of instructions which, when executed by a processor, cause the processor to perform the steps of:

modifying an original binary data block, having a first error detection code associated therewith, utilizing first data to generate a modified binary data block;

calculating a second error detection code for the first data; and

XORing the first and second error detection codes so as to generate a third error detection code for the modified data block.

44. The computer-readable medium of claim 43 wherein the sequence of instructions causes the processor to perform the step of modifying by adding the first data to the original data block, and to perform the step of calculating the second error detection code for the first data shifted to a position corresponding to the position thereof in the modified data block.

45. The computer-readable medium of claim 43 wherein the sequence of instructions causes the processor to perform the step of modifying by removing the first data from the original data block, and to perform the step of calculating the second error detection code for the first data shifted to position corresponding to the position thereof in the original data block.

46. The computer-readable medium of claim 43 wherein the step of modifying comprises shifting second data from an original position within the original data block to a modified position within the modified data block, and wherein the sequence of instructions causes the processor to perform the steps of:

calculating a fourth error detection code for the second data shifted to a position corresponding to the original position thereof within the original data block;

calculating a fifth error detection code for the second data shifted to a position corresponding to the modified position within the modified data block; and XORing the first, second, fourth and fifth error detection codes to generate the third error detection code for the modified data block.

47. The computer-readable medium of claim 43 wherein the sequence of instructions causes the processor to perform the step of modifying the original data block by encapsulation of the original data block.

48. The computer-readable medium of claim 47 wherein the sequence of instructions causes the processor to perform virtual local area network (VLAN) encapsulation.

49. The computer-readable medium of claim 43 wherein the sequence of instructions causes the processor to perform the step of modifying the original data block by unencapsulation of the original data block.

50. The computer-readable medium of claim 49 wherein the sequence of instructions causes the processor to perform virtual local area network (VLAN) unencapsulation.

* * * * *